United States Patent
Chien

[11] Patent Number: 5,888,866
[45] Date of Patent: Mar. 30, 1999

[54] METHOD FOR FABRICATING CAPACITORS OF A DYNAMIC RANDOM ACCESS MEMORY

[75] Inventor: Sun-Chieh Chien, Hsinchu, Taiwan

[73] Assignee: United Microelectronics Corp., Taipei, Taiwan

[21] Appl. No.: 75,098

[22] Filed: May 8, 1998

[30] Foreign Application Priority Data

Apr. 18, 1998 [TW] Taiwan ................................ 87105967

[51] Int. Cl.⁶ .......................................... H01L 21/8242
[52] U.S. Cl. ............................................ 438/254; 438/397
[58] Field of Search ..................................... 438/238, 239, 438/253–256, 381, 396–399

[56] References Cited

U.S. PATENT DOCUMENTS

5,807,775 9/1998 Tseng ...................................... 438/253
5,807,777 9/1998 Wu ......................................... 438/254
5,817,554 10/1998 Tseng ...................................... 438/253

*Primary Examiner*—Joni Chang
*Attorney, Agent, or Firm*—Thomas, Kayden, Horstemeyer & Risley, L.L.P.

[57] ABSTRACT

A method for fabricating capacitors of a DRAM by employing the liquid-phase deposition. Since the working temperature required for performing liquid-phase deposition is low, selective deposition can be performed on the area not covered by photoresist with the presence of the photoresist layer. The foregoing method comprises: filling up the contact hole with photoresist, and keeping up coating photoresist upward and horizontally; selectively depositing oxide on the area, that is not coated with photoresist, by utilizing the liquid-phase deposition process; removing the photoresist for forming an opening which forms the profile of the lower electrode of a capacitor; forming a conductive layer on the inner walls of the opening, and having the contact hole filled as well to form the lower electrode.

13 Claims, 8 Drawing Sheets

METHOD FOR FABRICATING CAPACITORS OF A DYNAMIC RANDOM ACCESS MEMORY

CROSS-REFERENCE TO RELATED APPLICATION

This application claims the priority benefit of Taiwan application serial no. 87105967, filed Apr. 18, 1998, the full disclosure of which is incorporated herein by reference.

BACKGROUND OF THE INVENTION

1. Field of the Invention

This invention relates to a method for fabricating capacitors of a dynamic random access memory (DRAM), and more particularly, to a method for fabricating capacitors of a DRAM by using selective interlayer dielectric formation technology.

2. Description of Related Art

Figure 1:
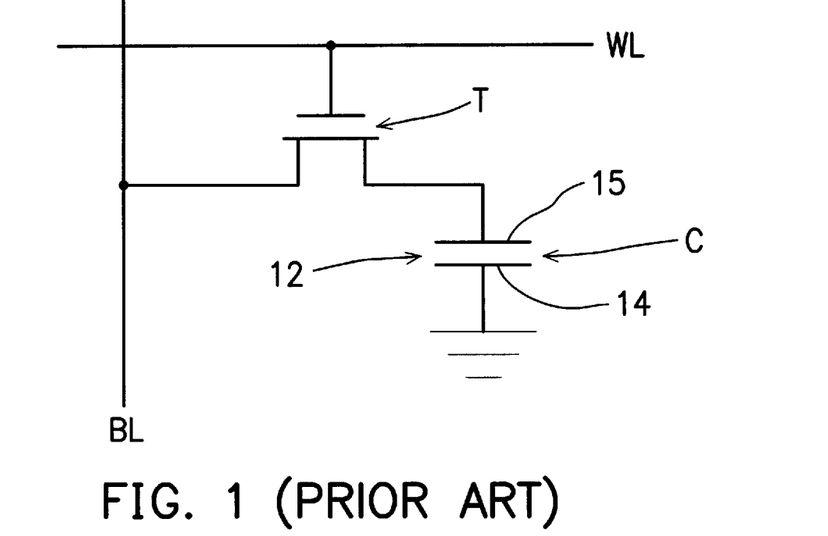
FIG. 1 is a diagram showing the circuit within a memory cell of a DRAM.

Referring to FIG. 1, it shows the circuit of a memory cell that comprises a MOS transistor T and a capacitor C within a DRAM, wherein the properties of charging and discharging on the capacitor can be used to store information. Generally, every digit in a binary information can be stored in a capacitor which will be charged is the stored digit is a logic 1, and a logic 0 if the capacitor is not charged. The source of the MOS transistor T is connected to a corresponding bit line BL, and the drain of the MOS transistor T is connected to the storage electrode (or lower electrode) 15 of the capacitor C, and the gate of the MOS transistor T is connected to a corresponding word line. The upper electrode is connected to a fixed voltage source. There is a dielectric layer 12 filled between the upper electrode 14 and lower electrodes 15 of the capacitor C.

Since the capacitor is the major device used by a memory cell for storing information. If the capacitance of the capacitor is high, the effect caused by noise will be reduced when a piece of information is read, and it will further reduce the frequency of refreshing.

A conventional method for fabricating cylinder capacitors of a DRAM is shown in FIGS. 2A through 2E. As referring to FIG. 2A, a field effect transistor is formed on the surface of a semiconductor substrate 200 such as a p-type silicon substrate, and the field effect transistor is isolated by field oxide 204, wherein the field effect transistor contains a gate 212, and source/drain 222 and 232. Then, an isolation layer 206 and an etching stop layer 216 are formed in sequence on the substrate 200. A contact hole is formed through the isolation layer and the etching stop layer for exposing the source/drain region 222 which is designed to be coupling with transistor, wherein the isolation layer 206 includes oxide, and the etching stop layer 216 includes silicon nitride. The contact hole is then filled with conducting material, such as polysilicon, to form a conductive plug 242.

Figure 2A:
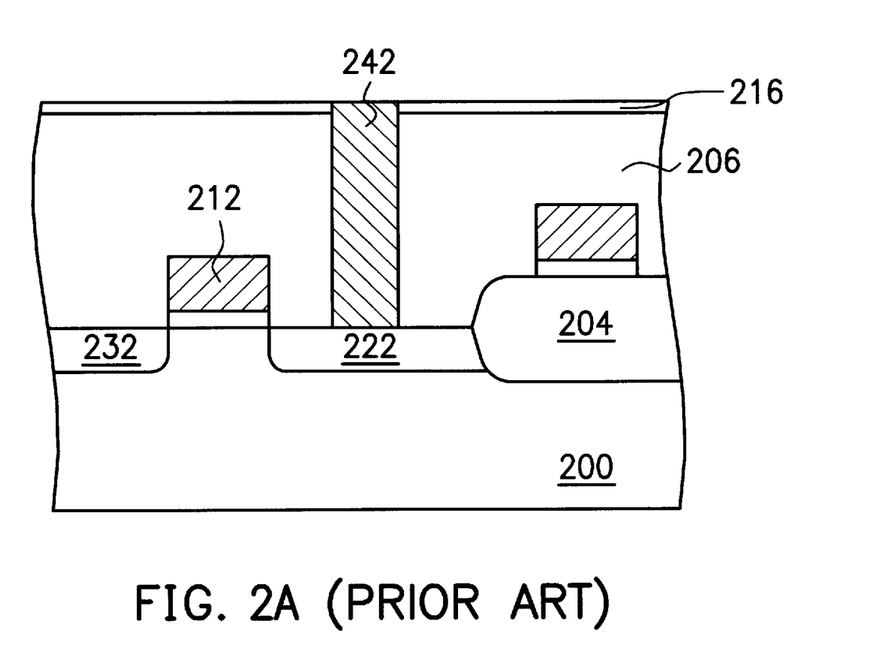
FIGS. 2A through 2E showing a conventional method for fabricating the cylinder capacitors of a DRAM.
Figure 2B:
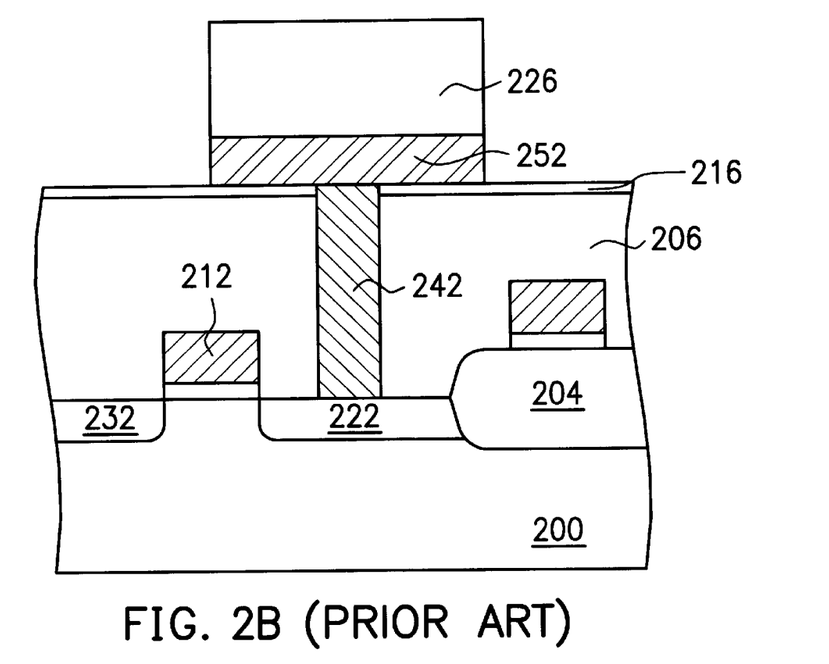

Referring to FIG. 2B, a conductive layer 252 and a dummy oxide layer 226 are formed on the top of the etching stop layer 216 in sequence, and the bottom region of a lower electrode of the desired cylinder capacitor is defined and has contact with the conductive plug 242, wherein the conductive layer 252 includes doped polysilicon, and the dummy oxide layer 226 includes borophosphosilicate glass (BPSG) or phosphosilicate (PSG).

Figure 2C:
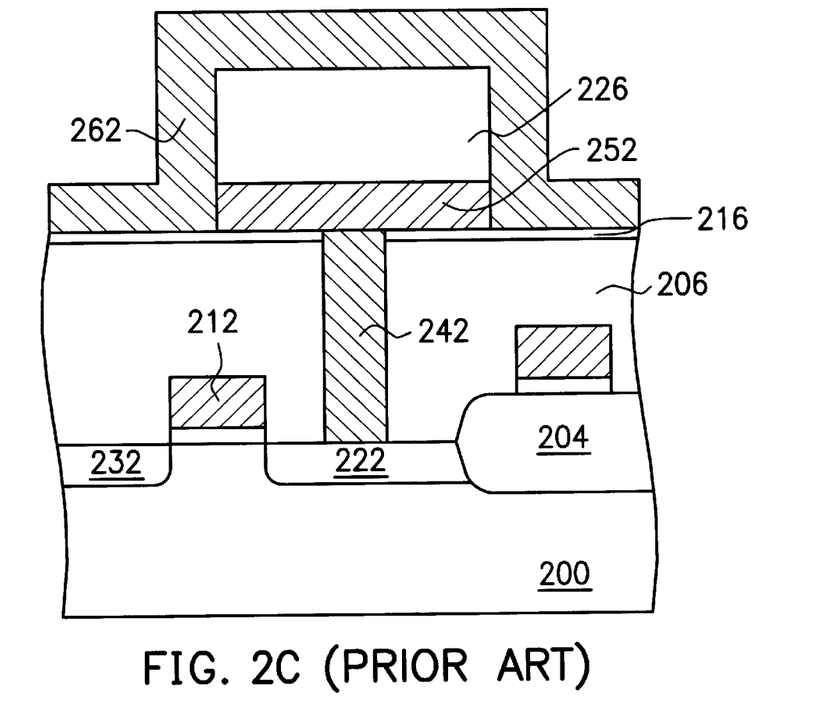

Referring to FIG. 2C, a conductive layer 262 is form for covering everything on the top of the substrate 200, wherein the conductive layer includes doped polysilicon.

Figure 2D:
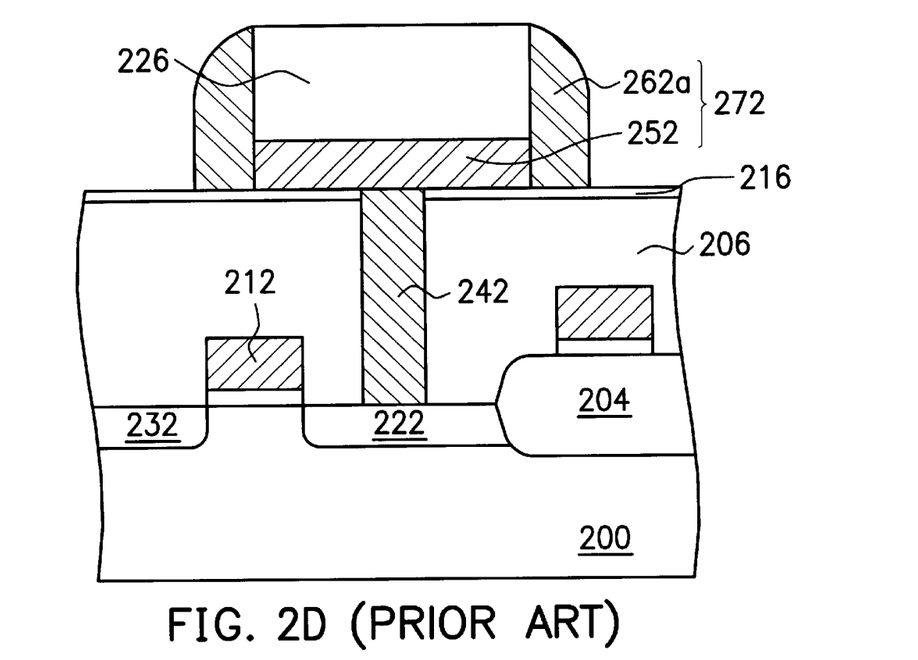

Referring next to FIG. 2D, an anisotropic etching process is performed for forming the conductive spacers 262a, which is against the dummy oxide layer 226 and in contact with the conductive layer 252, by using the etching stop layer 216 as the etching ending, wherein the conductive spacers 262a and conductive layer 252 construct the lower electrode of the cylinder capacitor 272.

Figure 2E:
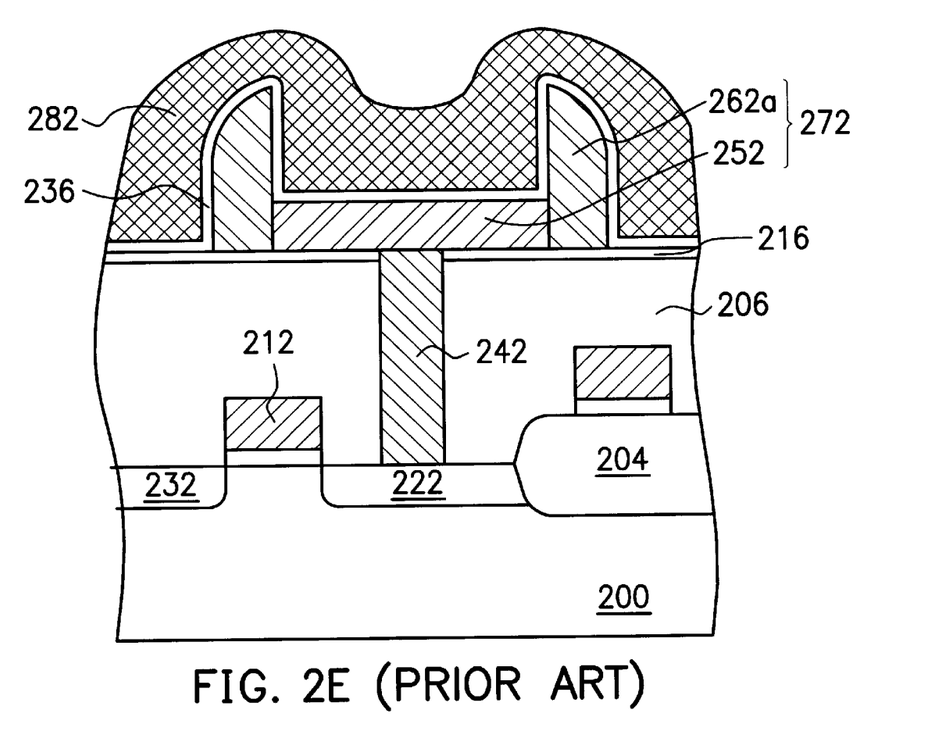

Referring next to FIG. 2E, the dummy oxide layer is removed by a wet etching method. A dielectric layer 236 having a thickness of approximate 10 Å~60 Å is then formed on the exposed surface of the lower electrode of the cylinder capacitor 272, wherein the dielectric includes silicon oxide, silicon nitride/silicon oxide (NO) structure, silicon oxide/silicon nitride/silicon oxide (ONO) structure, or other dielectric materials of high permittivities such as $Ta_2O_5$, $Pb(Zr,Ti)O_3$ (i.e. PZT), or $(Ba,Sr)TiO_3$ (i.e. BST).

After that, a conductive layer 282 is formed on the top surface of the dielectric layer 236 as the upper electrode of the cylinder capacitor for accomplishing the capacitor of a DRAM.

However, the conventional method for fabricating cylinder capacitors of a DRAM is too complicated, and the fabrication cost is not economical.

SUMMARY OF THE INVENTION

It is therefore an objective of the present invention to provide method of fabricating cylinder capacitors of a DRAM for simplifying and shorten the fabrication process, and bringing down the fabrication cost.

In accordance with the foregoing and other objectives of the present invention, The method according to the present invention has applied the liquid-phase deposition technique on the fabricating the capacitors of a DRAM. Since the required temperature for performing liquid-phase deposition is relatively low, materials can be selectively deposited only on the regions that are not covered by photoresist during the deposition process for simplifying the fabricating method and shortening the fabricating process. The method according to the present invention comprises the steps of: filling up the contact hole with photoresist, and further having photoresist expanded upward and horizontally; having oxide selectively deposited on the regions that are not covered by photoresist by applying liquid-phase deposition; removing the photoresist for forming a opening containing the contact hole as the aspect of the lower electrode of the capacitor; and forming a conductive layer on the inner walls of the opening, and filling up the contact hole with conductive material as well to form the lower electrode.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A conventional method for forming an oxide layer by using chemical vapor deposition (CVD) requires a high-temperature environment of about 300° C.~800° C. However, photoresist is about to be ashing at the temperature of 200° C., and that will cause the absence of the photoresist during the deposition process of oxide. Currently, the liquid-phase deposition (LPD) has been developed to perform the task of selectively forming interlayer dielectric, and it has been disclosed by Homma in "A New Interlayer Formation Technology For Completely Planarized Multilevel Interconnection By Using LPD" [Symposium on VLSI Technology, pp3–4 (1990)]. This liquid-phase deposition technique is not only capable of selectively forming dielectric, but also capable of processing with photoresist because of its low working temperature at about 25° C.~40° C.

Compared with chemically vapor-deposited oxide, the liquid-phase deposited oxide has numerical advantage including: a denser property, a smaller refractive index, a smaller tensile stress, an etching rate of the CVD, a lower leakage current, higher Breakdown field, and a smaller permittivity.

Therefore, the present invention that applies the liquid-phase deposition technique, which doesn't require a high working temperature, can process deposition with the presence of photoresist for shortening the process of fabricating capacitors of a DRAM during fabricating capacitors of a DRAM.

A method of a preferred embodiment according to the present invention for fabricating capacitors of a DRAM is shown in FIG. 3A through 3J.

Figure 3A:
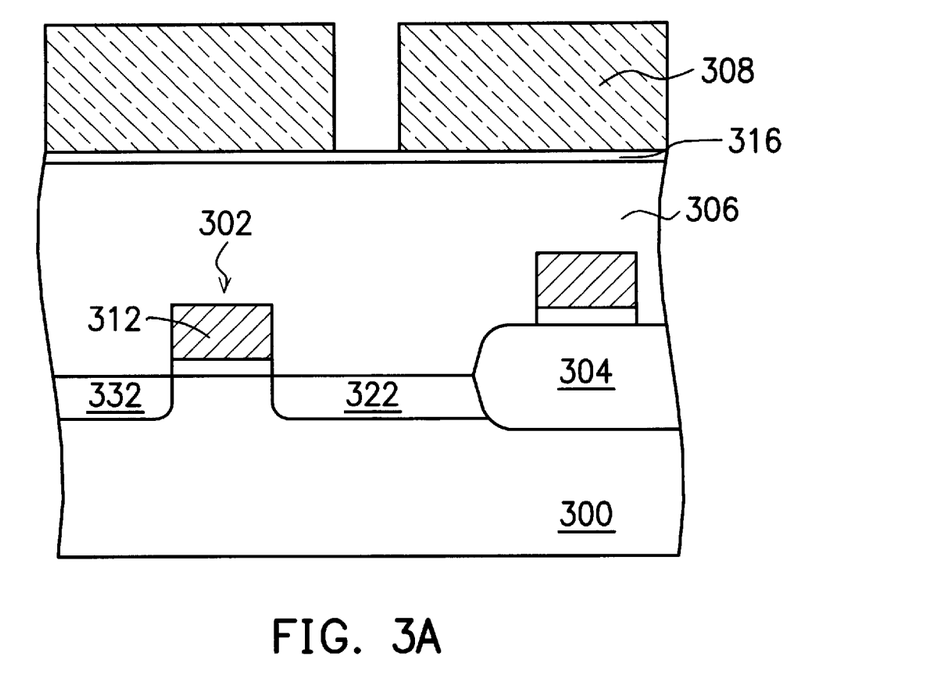
FIGS. 3A through 3J showing a method for fabricating capacitors of a DRAM, according to a preferred embodiment of the present invention.

Referring first to FIG. 3A, a field effect transistor 302 is formed on the surface of a semiconductor substrate 300 such as a p-type silicon substrate. The field effect transistor 302 is formed on the active area, and isolated by a field oxide 304, wherein the field effect transistor 302 includes a gate 312, and source/drain regions 322 and 332. Then, dielectric layers 306 and 316 are formed on the top of the substrate 300 in sequence, wherein the dielectric layer 306 and 316 are formed by different materials, such as oxide and silicon nitride. A defined photoresist 308, which is used to define the region designed for forming the contact hole, is then formed on the top of the dielectric layer 316.

Figure 3B:
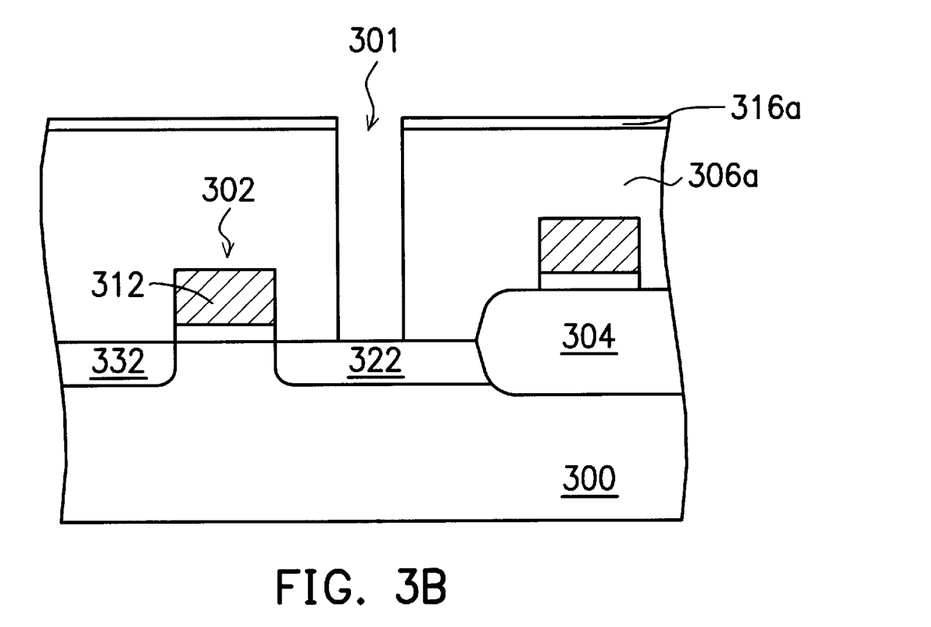

Referring next to FIG. 3B, the photoresist 308 is then used as a mask to perform the etching process for forming the contact hole. The dielectric layers 306 and 316 are etched through to form dielectric layers 306a and 316a, and a contact hole 301. The source/drain 322 that is desired to be a part of a capacitor is then exposed. After this etching process, the photoresist is removed.

Figure 3C:
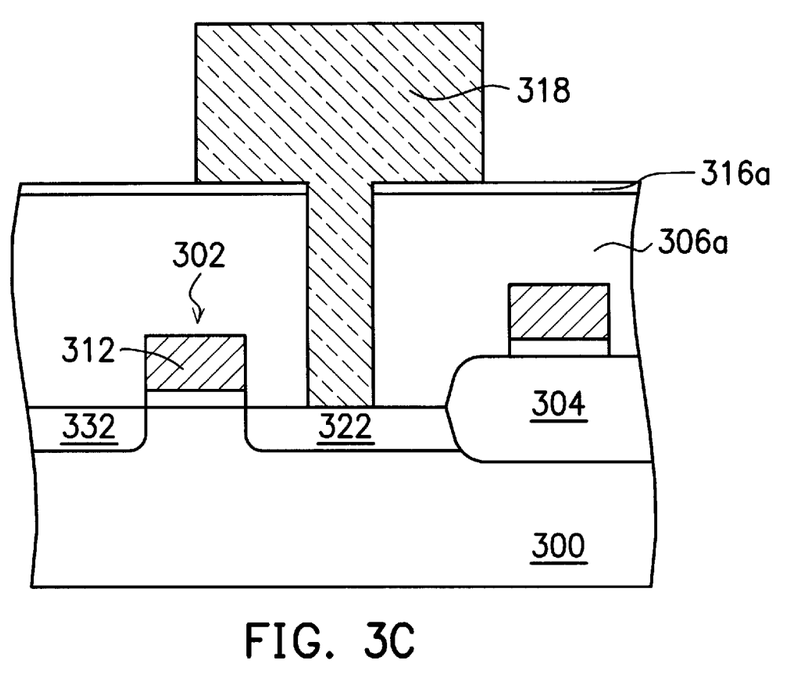

As referring to FIG. 3C, another photoresist layer 318 is deposited on the top of the dielectric layer 316a, wherein the photoresist, which is defined by going through the photolithography process, covers the area designed for forming the cylinder capacitor. The contact hole is now filled with photoresist, as well as a part of the top surface of the dielectric layer 316a is covered by photoresist, that is, the photoresist layer is going upward and expanded horizontally.

Figure 3D:
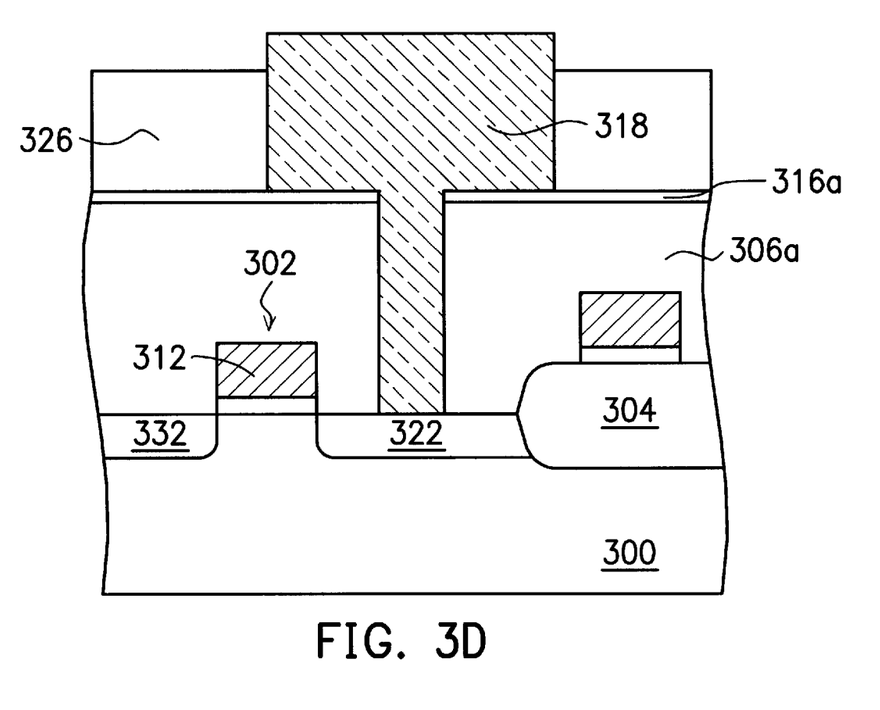

Referring to FIG. 3D, a dielectric layer 326 such as oxide is then deposited on the surface that is not covered by photoresist 318 by using PLD technique, which is having silicon particles, such as $SiO_2$, of high-purity dissolved into hydrofluosilicic acid of about 35° C., continuously adding boric acid into the solution described therein before in order to obtain a silicic supersaturated solution. A dielectric layer 326 can then be formed by sinking the whole substrate 300 into the silicic supersaturated solution at the temperature of 25° C.~40° C.

By employing PLD technique, depositing oxide can be performed at a relatively low temperature, so that it can reduce the times a semiconductor device has to be exposed in a high-temperature environment. As a result, the quality of the capacitors of a DRAM can be improved.

Figure 3E:
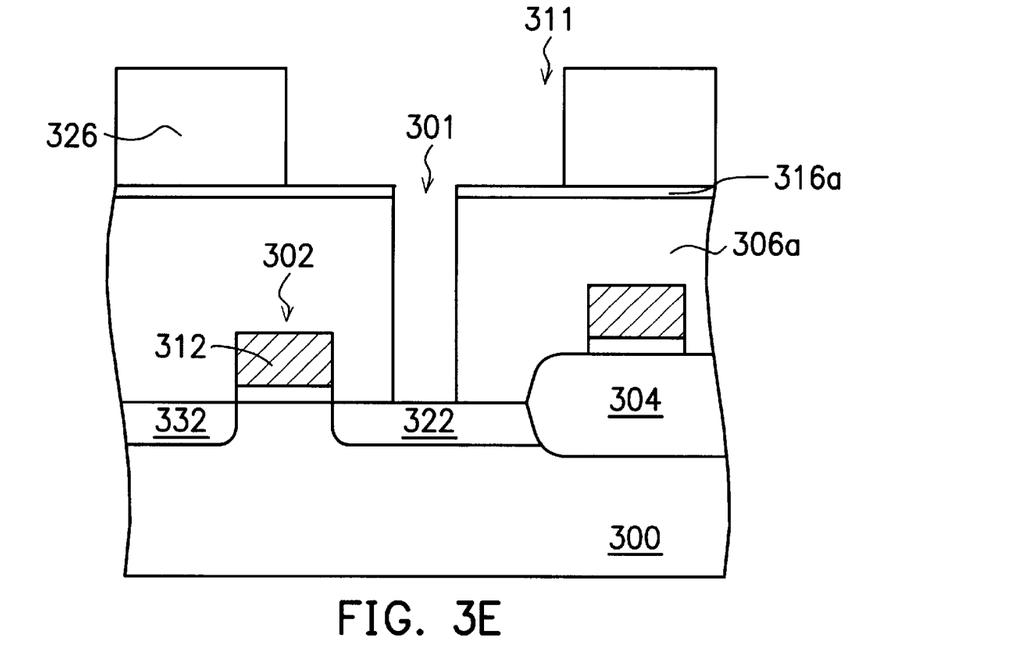

Referring to FIG. 3E, the photoresist is removed to form the opening 311 and expose the previous contact hole 301 by using a method such as oxygen plasma dry etching, or $H_2SO_4/H_2O_2$ wet etching. Then, a T-shape opening including an opening 311 and a contact hole 301 is formed.

The process of forming the T-shape opening can be shortened by using photoresist 318 as the mask in the selectively deposition process because the photoresist 318 can be easily formed, defined, and removed.

Figure 3F:
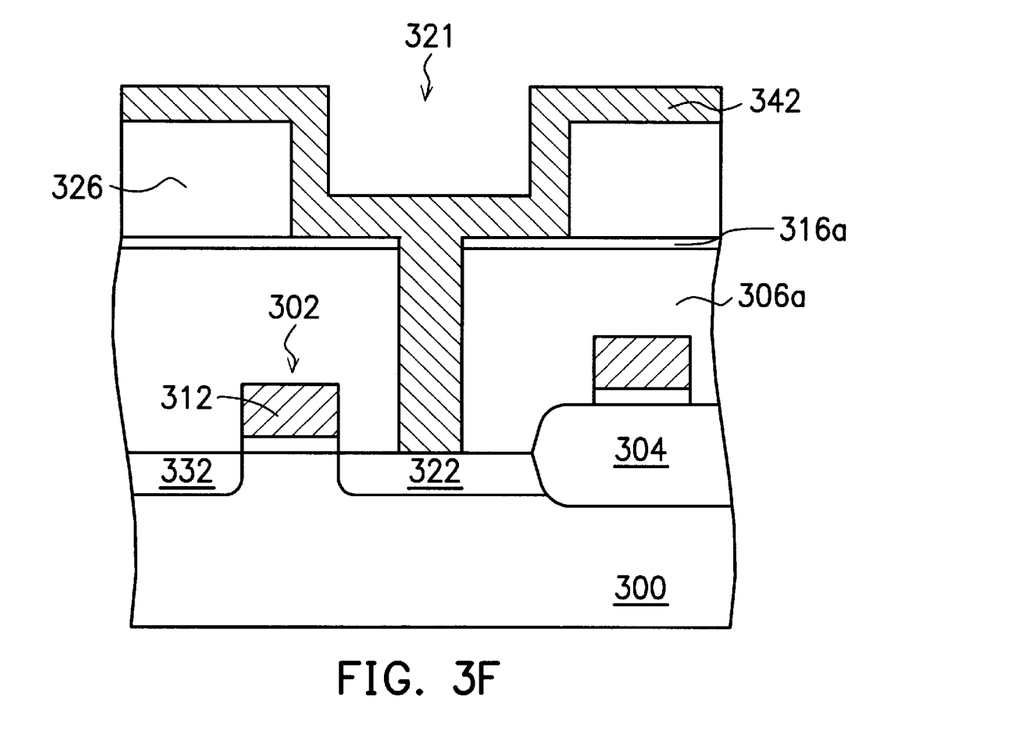

Referring to FIG. 3F, a conductive layer 342, such as doped polysilicon, of a thickness of 300 Å~1000 Å is formed on the top of the substrate 300 for covering the opening 311 and exposed surfaces of dielectric layers 316a and 326,and filling up the contact hole 301, to have a electrical coupling with the source/drain region 322. An opening 321 is then formed on the top of the conductive layer 342.

The next step which is to convert the conductive layer 342 into the lower electrode of a cylinder capacitor can be performed by two methods, wherein the first method is to perform an etch back on the conductive layer 342 after the opening 321 is filled up with flow oxide, and wherein the second method is to perform a chemically mechanical polishing (CMP) process on the conductive layer 342 directly.

Figure 3G:
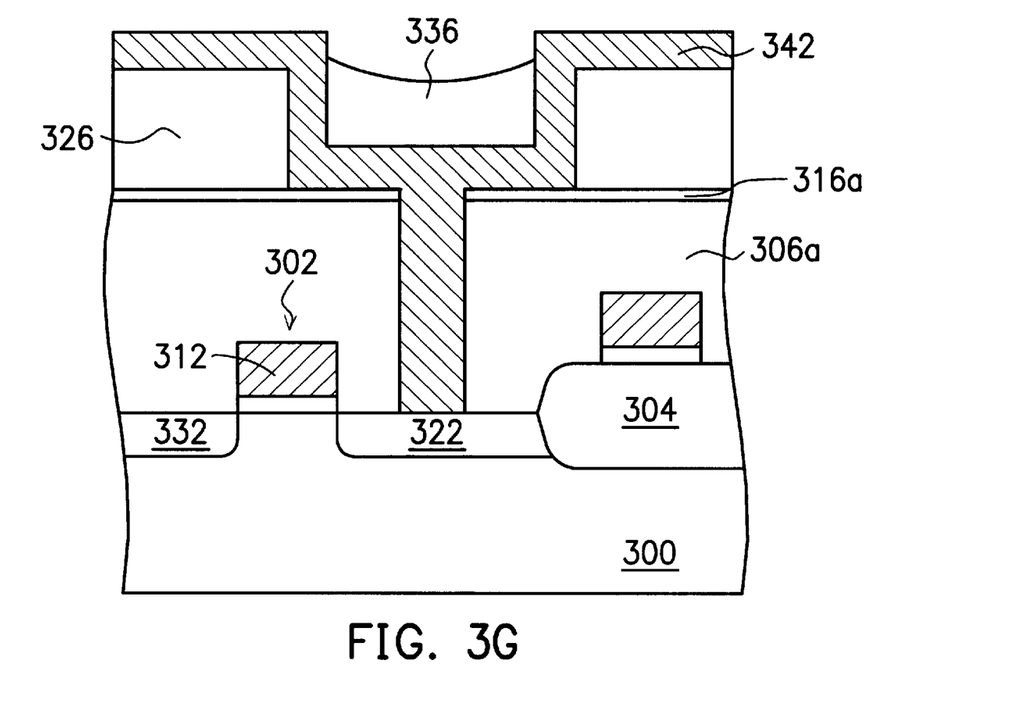
Figure 3H:
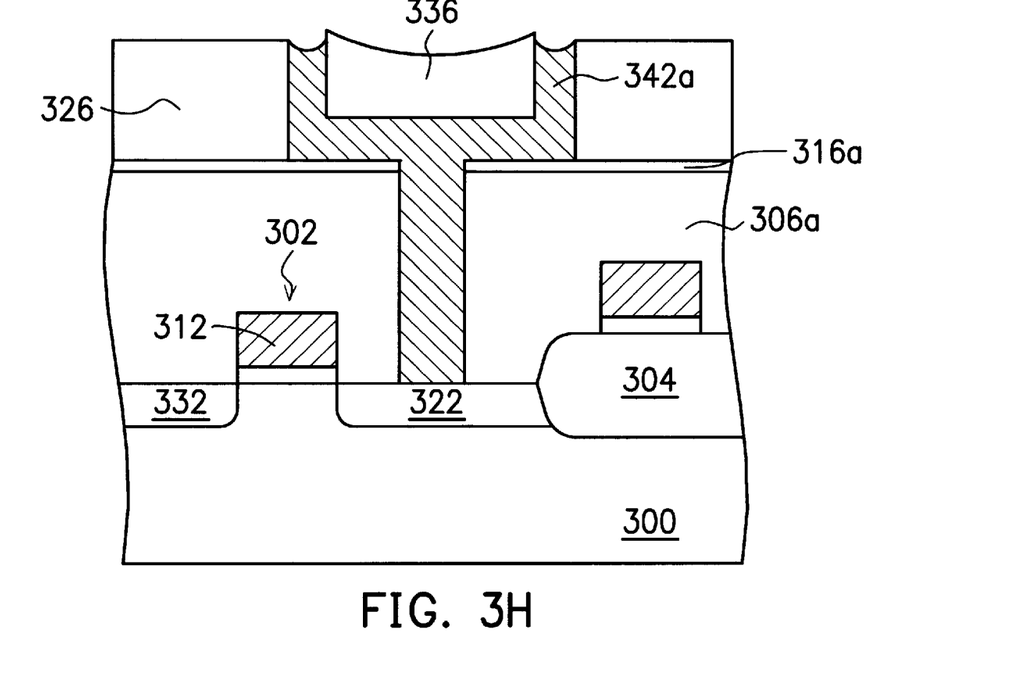
Figure 3I:
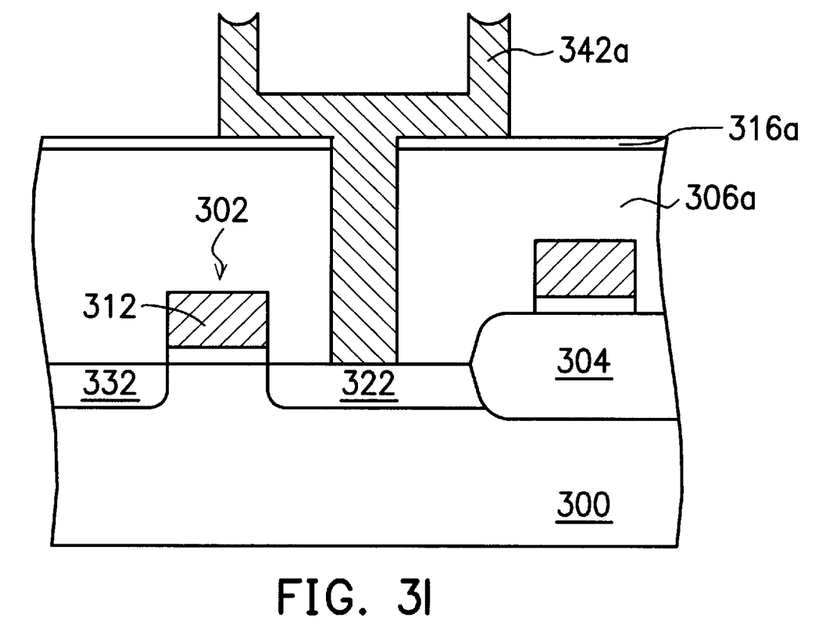

FIGS. 3G to 3I show the first method for forming the lower electrode of a cylinder capacitor. Referring to FIG. 3G, a layer of a filling material is formed on the top of the conductive layer 342, and the opening 321 is filled up with the same material which can be a flow oxide such as BPSG, or photoresist. Then, an etch back or CMP process is performed on the filling material 336 within the opening 321. A part of the surface of the conductive layer 342 will be exposed after the process thereinbefore.

Referring next to FIG. 3H, an etch back or CMP process is continuously performed on the conductive layer 342 till the dielectric layer 326 is exposed, for forming the a conductive layer 342a which is cylindrical and has filling material 336 filled in the opening 321.

Referring next to FIG. 3I, the dielectric layer 326 and the filling material 336 are removed for exposing the profile of the conductive layer 342a which is the lower electrode of a capacitor. The removing method can be wet etching with employing dielectric layer 316a as an etching stop layer if the filling material is flow oxide. The dielectric layer 326 and filling material have to be removed respectively if the filling material 336 is photoresist.

Referring to FIG. 3I, the second method for converting the conductive layer 342 into a lower electrode of a cylinder capacitor is to perform CMP directly on the conductive layer 342 to form conductive layer 342a, and then remove the dielectric layer 326 by employing wet etching with dielectric layer 316a as an etching stop layer for exposing the profile of the conductive layer 342a which is the desired lower electrode of a cylinder capacitor.

Figure 3J:
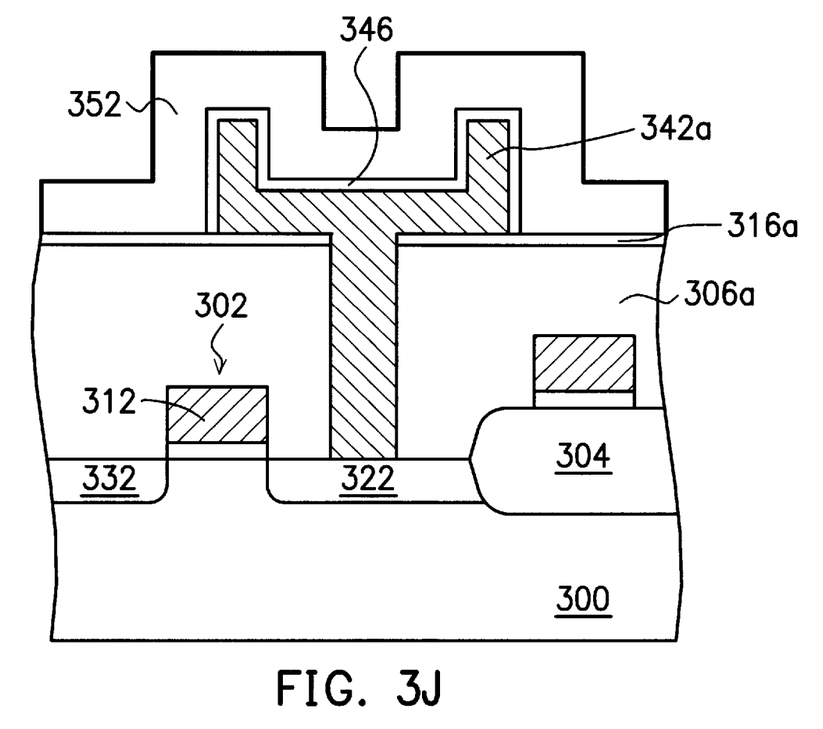

Referring next to FIG. 3J, a dielectric layer 346 having a thickness of 10 Å~60 Å is formed on the exposed surface of the conductive layer, wherein the dielectric layer 346 includes one of silicon oxide, NO structure, ONO structure, or other dielectric materials of high permittivities such as $Ta_2O_5$, PZT and BST. A conductive layer 352 having a thickness of 300 Å~1000 Å is formed on the surface of the dielectric layer 346 as a upper electrode for accomplishing a capacitor of a DRAM.

The method for fabricating cylinder capacitors of a DRAM according to the present invention can simplify the process for fabricating capacitors of a DRAM, and reduce the fabrication cost as well.

The first characteristic of the present invention is to reduce the times that a semiconductor substrate has to be exposed under a high-temperature environment by employing liquid-phase deposition to have oxide deposited under a relatively low temperature. As a result, the qualities of capacitors of A DRAM can be improved.

The second characteristic of the present invention is to use photoresist as a mask for selectively deposition of oxide by employing liquid-phase deposition to simplify the process of fabricating capacitors of a DRAM to bring down the fabrication cost.

The invention has been described using exemplary preferred embodiments. However, it is to be understood that the scope of the invention is no limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a capacitor of a DRAM comprising:

providing a semiconductor substrate having a transfer transistor, a first dielectric layer, and a second dielectric layer in sequence, wherein the transfer transistor further comprises source/drain regions, wherein the first dielectric layer and the second dielectric layer are over the substrate, and wherein the first dielectric layer and the second dielectric layer form an opening on the first dielectric layer and the second dielectric layer to expose one of the source/drain regions;

forming a photoresist layer for filling up the opening, wherein the photoresist layer is patterned on a region of the capacitor, so that a first portion of the second dielectric layer is exposed;

forming a third dielectric layer on the first exposed portion of the second dielectric layer, wherein the third dielectric layer has two lateral surfaces;

removing the photoresist layer, so that a second portion of the second dielectric layer is exposed;

forming a first conductive layer on the lateral surfaces of the third dielectric layer and the second exposed portion of the second dielectric layer, wherein the first conductive layer is further filled into the opening, and is electrically coupled to one of the source/drain regions for constructing a lower electrode of the capacitor;

removing the third dielectric layer; and forming a forth dielectric layer and a second conductive layer on a exposed surface of the first conductive layer, wherein the second conductive layer is a upper electrode of the capacitor.

2. The method of claim 1, wherein the first dielectric layer includes oxide.

3. The method of claim 1, wherein the second dielectric layer includes nitride.

4. The method of claim 1, wherein a method for selectively forming the third dielectric layer includes depositing an oxide layer by employing liquid-phase deposition.

5. The method of claim 4, wherein a required temperature for performing the liquid-phase deposition is about 25° C.~40° C.

6. The method of claim 1, wherein said step for forming the first conductive layer on the lateral surface of the third dielectric layer and the partially exposed surface of the second dielectric layer further comprises: depositing a conformal layer of conductive material on an exposed surface of the third dielectric layer and a partially exposed surface of the second dielectric layer before performing chemically mechanical polishing, for forming the first conductive layer.

7. The method of claim 1, wherein the method for forming the first conductive layer on the lateral surface of the third dielectric layer and the partially exposed surface of the second dielectric layer further comprises: depositing a conformal layer of conductive material on a exposed surface of the third dielectric layer and a partially exposed surface of the second dielectric layer before performing chemically mechanical polishing, for forming the first conductive layer; followed by depositing a filling material for covering the entire semiconductor substrate and devices thereon; followed by process etch back on the filling material and the conductive material in sequence for forming the first conductive layer; and then, removing the filling material.

8. The method of clam 1, wherein a method for removing the third dielectric layer includes a wet etching process with the second dielectric layer as an etching stop layer.

9. A method for fabricating capacitors of a DRAM, providing a semiconductor substrate having a transfer transistor, a first dielectric layer, and a second dielectric layer in sequence, wherein the transfer transistor further comprises source/drain regions, wherein the first dielectric layer and the second dielectric layer are over the substrate, and wherein the first dielectric layer and the second dielectric layer form an opening on the first dielectric layer and the second dielectric layer to expose one of the source/drain regions of the transfer transistor, comprising:

forming a photoresist layer for filling up the opening, wherein the photoresist layer is patterned on a region of the capacitor so that a first portion of the second dielectric layer is exposed;

forming a third dielectric layer on the first exposed portion of the second dielectric layer by employing a liquid-phase deposition process, wherein the third dielectric layer has two lateral surfaces;

removing the photoresist layer, so that a second portion of the second dielectric layer is exposed;

forming a first conductive layer on the lateral surfaces of the third dielectric layer and a partially exposed surface of the second dielectric layer, wherein the first conductive layer is further filled into the opening, and is electrically coupled to the source/drain region;

removing partial the first conductive layer by using the third dielectric layer as an etching stop layer for make the first conductive layer a lower electrode of the capacitor;

removing the third dielectric layer; and forming a forth dielectric layer and a second conductive layer on a exposed surface of the first conductive layer, wherein the second conductive layer is a upper electrode of the capacitor.

10. The method of claim 9, wherein the liquid-phase deposition process requires a working temperature of about 25° C.~40° C., wherein the third dielectric layer includes an oxide layer.

11. The method of claim 9, wherein the said step of removing the first conductive layer by using the third dielectric layer as the etching stop layer further includes a chemically mechanical polishing process.

12. The method of claim 9, wherein the said step of removing the first conductive layer by using the third dielectric layer as the etching stop layer further includes depositing a filling material for filling up the entire surface of the semiconductor substrate; followed by processing etch back on the filling material by using the third dielectric layer as the stop layer; and then removing the filling material.

13. The method of claim 9, wherein a method for removing the third dielectric layer includes a wet etching process with the second dielectric layer as the etching stop layer.

* * * * *